US011022665B2

(12) United States Patent
Setsompop et al.

(10) Patent No.: US 11,022,665 B2
(45) Date of Patent: Jun. 1, 2021

(54) METHOD FOR ECHO PLANAR TIME-RESOLVED MAGNETIC RESONANCE IMAGING

(71) Applicant: The General Hospital Corporation, Boston, MA (US)

(72) Inventors: Kawin Setsompop, Charlestown, MA (US); Lawrence L. Wald, Cambridge, MA (US); Fuyixue Wang, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 43 days.

(21) Appl. No.: 16/430,349

(22) Filed: Jun. 3, 2019

(65) Prior Publication Data
US 2019/0369185 A1     Dec. 5, 2019

Related U.S. Application Data

(60) Provisional application No. 62/679,320, filed on Jun. 1, 2018.

(51) Int. Cl.
*G01R 33/48* (2006.01)
*G01R 33/565* (2006.01)
*G01R 33/56* (2006.01)
*G01R 33/561* (2006.01)

(52) U.S. Cl.
CPC ....... *G01R 33/482* (2013.01); *G01R 33/5602* (2013.01); *G01R 33/5616* (2013.01); *G01R 33/56563* (2013.01)

(58) Field of Classification Search
CPC ............ G01R 33/482; G01R 33/56563; G01R 33/5602; G01R 33/5616; G01R 33/4822; G01R 33/5618; G01R 33/4818; G01R 33/5611; G01R 33/5608
See application file for complete search history.

(56) References Cited

U.S. PATENT DOCUMENTS

| 2015/0108977 A1* | 4/2015 | Kim | G01R 33/5611 324/309 |
| 2020/0072928 A1* | 3/2020 | Patil | G01R 33/5602 |

* cited by examiner

*Primary Examiner* — Susan S Lee
(74) *Attorney, Agent, or Firm* — Quarles & Brady LLP

(57) ABSTRACT

Systems and methods for magnetic resonance imaging ("MRI") that address the geometric distortions and blurring common to conventional echo planar imaging ("EPI") sequences, and that provide new temporal signal evolution information across the EPI readout, are described. Echo planar time-resolved imaging ("EPTI") schemes are described to implement an accelerated sampling of a hybrid space spanned by the phase encoding dimension and the temporal dimension. In general, each EPTI shot covers a segment of this hybrid space using a zigzag trajectory with an interleaved acceleration in the phase-encoding direction. The hybrid space may be undersampled and a tilted reconstruction kernel used to synthesize additional data samples.

26 Claims, 11 Drawing Sheets
(3 of 11 Drawing Sheet(s) Filed in Color)

A time series of images with different contrasts

METHOD FOR ECHO PLANAR TIME-RESOLVED MAGNETIC RESONANCE IMAGING

CROSS-REFERENCE TO RELATED APPLICATIONS

This application claims the benefit of U.S. Provisional Patent Application Ser. No. 62/679,320 filed on Jun. 1, 2018, and entitled "METHOD FOR ECHO PLANAR TIME-RESOLVED MAGNETIC RESONANCE IMAGING," which is herein incorporated by reference in its entirety.

STATEMENT REGARDING FEDERALLY SPONSORED RESEARCH

This invention was made with government support under EB020613, EB019437, and EB015896 awarded by the National Institutes of Health. The government has certain rights in the invention.

BACKGROUND

Echo planar imaging ("EPI") is a commonly-used MR acquisition technique due to its fast speed. However, there are two major problems with EPI: it suffers from geometric distortions along the phase-encoding direction, and it only obtains a single-contrast image at the effective echo time, with blurring effects from other time points in the EPI readout. These problems significantly compromise the quality of images obtained using EPI in functional imaging, diffusion imaging, and perfusion imaging, and also limit its ability to achieve high-quality anatomical and quantitative imaging.

For single-shot EPI ("SS-EPI"), the signal is acquired to fill a 45 degree diagonal line in the $k_y$-t space, with $T_2/T_2^*$ decay and susceptibility-induced phase accumulating over time, leading to blurring and distortion in the final image. To correct for this distortion, a pair of datasets with reversed phase-encoding is usually acquired. Such acquisitions obtain a +45 degree and a −45 degree diagonal line in the $k_y$-t space, with more information to estimate and correct for the susceptibility-induced distortion. To obtain multiple-contrast images, multi-echo EPI methods can be used, but suffer from limited number of echoes as well as image distortions and blurring.

If data are acquired to fully-sample $k_y$-t space, distortion-reduced and blurring-reduced images with different contrasts can be obtained at different echo times with a spacing-interval of an echo-spacing. Such fully-sampled $k_y$-t data can be achieved through several existing techniques, but these techniques require extremely long scans, especially for high-spatial resolution.

SUMMARY OF THE DISCLOSURE

The present disclosure addresses the aforementioned drawbacks by providing a method for producing an image with a magnetic resonance imaging ("MRI"). Data are acquired with an MRI system by sampling a hybrid space along a zigzag trajectory. The hybrid space spans a first axis along a temporal dimension and a second axis along a phase-encoding k-space dimension. An image is reconstructed from the acquired data. In some implementations, multi-contrast images without $B_0$ distortions or $T_2^*$ blurring may be reconstructed from the acquired data.

It is another aspect of the present disclosure to provide a method for producing an image with an MRI system, in which data are acquired with an MRI system by sampling k-space along a plurality of interleaved phase encoding lines such that temporally adjacent phase encoding lines are separated in time by a first temporal spacing and phase encoding lines that are adjacent in k-space are separated in time by a second temporal spacing that is greater than the first temporal spacing. An image is then reconstructed from the acquired data. In some implementations, multi-contrast images without $B_0$ distortions or $T_2^*$ blurring may be reconstructed from the acquired data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 5A shows an inversion pulse is followed by a small-flip-angle train and a VFA-GRASE train to obtain EPTI-encoded data. The signal evolution with T1 recovery, T2*, and T2 decay is captured by such acquisition. FIG. 5B shows that after each small-flip-angle/VFA-GRASE pulse, an EPTI readout can be employed to acquire a $k_y$-$k_z$ block in the 3D k-space (e.g., block size $R_{yblock} \times R_{zblock}$=12×6 with 72 phase/partition encodings). FIG. 5C shows that these Cartesian blocks from all TRs form a radial-blade for each TI position, which rotates around the center of k-space by a golden angle for the next TI position.

FIG. 6A shows a diagram of an example 3D GE-EPTI sequence and its block-wise sampling in $k_y$-$k_z$-t space per EPTI-shot. A spatiotemporal CAIPI trajectory is employed, which enables effective use of coil sensitivity information to recover highly undersampled $k_y$-$k_z$-t data. Data blocks of different $k_y$-$k_z$ positions are acquired sequentially across TRs to fill $k_y$-$k_z$ space. FIG. 6B shows signal evolution curves with $T2^*$ decay simulated based on the tissue and acquisition parameters. The subspace bases are extracted and used to approximate the actual temporal signal evolution.

DETAILED DESCRIPTION

Figure 1A:
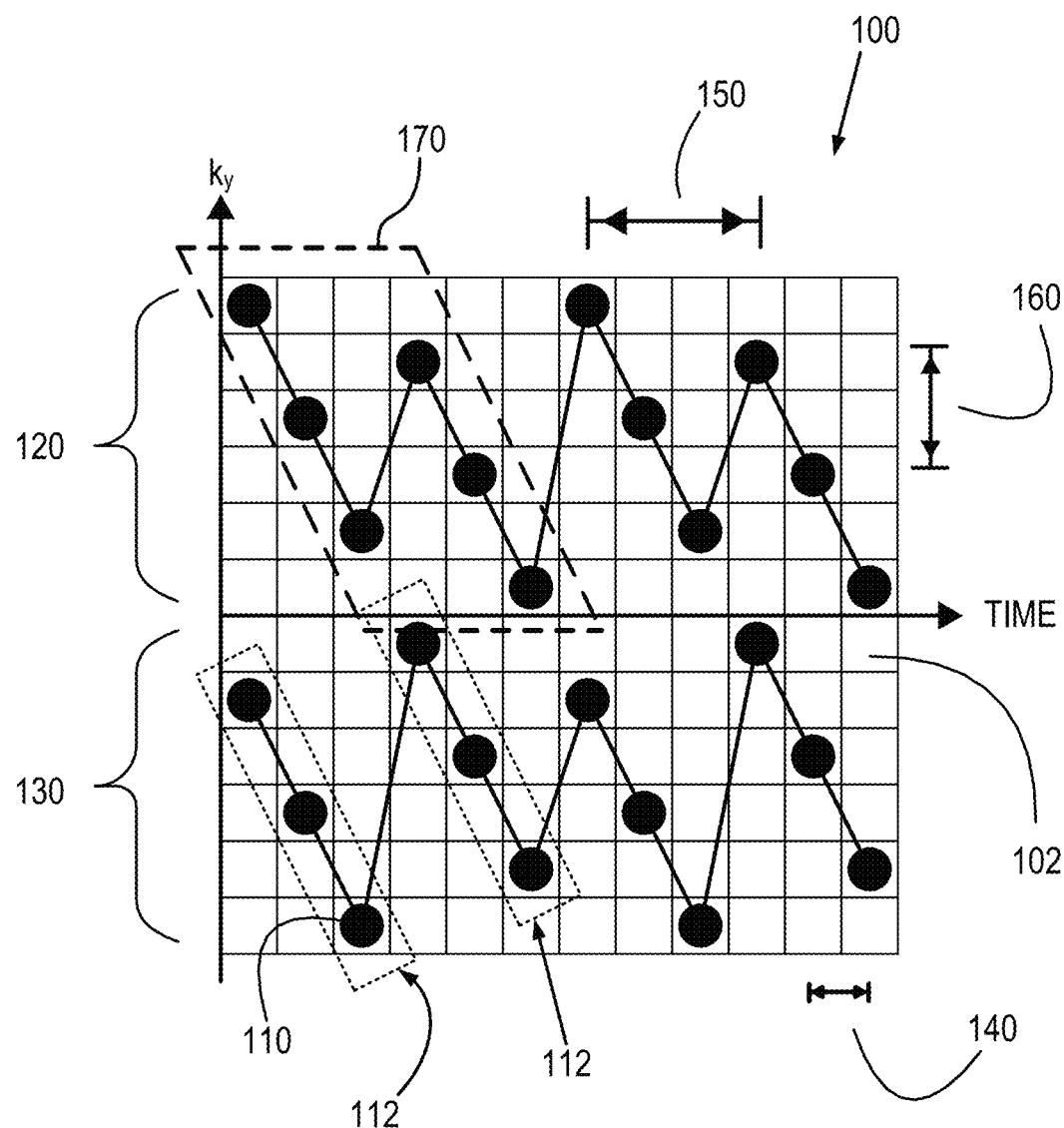
FIG. 1A is a graphic illustration of an example sampling pattern that can be employed when practicing some embodiments described in the present disclosure.

Described here are systems and methods for magnetic resonance imaging that addresses the geometric distortions and blurring common to conventional echo planar imaging ("EPI") sequences by using an echo planar time-resolved imaging ("EPTI") scheme. The systems and methods described in the present disclosure implement an accelerated sampling of a hybrid space spanned by the phase encoding dimension and the temporal dimension. As one example, the hybrid space is spanned by the k dimension in k-space and the temporal dimension, t, and thus may be referred to as k-t space. In general, each EPTI shot covers a segment of this hybrid space using a zigzag trajectory with an interleaved acceleration in the phase-encoding direction. The systems and methods described in the present disclosure also provide temporal signal evolution information across the EPI readout window.

The systems and methods described here can be implemented for anatomical imaging, multiple-contrast imaging, quantitative imaging, and so on. As one non-limiting example, the systems and methods can be implemented to provide for simultaneous quantitative $T_2$/$T_2^*$ mapping and susceptibility weighted imaging ("SWI"). In some embodiments, such imaging may performed on the order of 30 s at a resolution of 1×1×3 $mm^3$ across multiple slices, thereby enabling whole-brain coverage in approximately 30 s. Thus, using only a few shots, a time-series of multi-contrast images can be created free of distortion and blurring, which can be advantageous for numerous applications where undistorted images across multiple-contrasts are desired. In one embodiment, multi-echo properties allow for use in many applications, such as for improving phase, SWI, quantitative susceptibility mapping ("QSM"), functional MRI ("fMRI"), and the like through better signal modeling.

In general, the systems and methods described in the present disclosure implement a pulse sequence that is adapted to more fully sample a hybrid space spanned by a phase encoding dimension and a temporal dimension. As one example, data are acquired by sampling this hybrid space based on a zigzag pattern with interleaved phase encoding lines, as noted above.

The EPTI techniques described in the present disclosure not only achieve distortion-free and blurring-free imaging, but they are also capable of obtaining up to 100 $T_2$ and $T_2^*$-weighted images across the Echo Planar Imaging (EPI) readout window, spaced at a time interval that may be within that of the EPI's echo time spacing (e.g., about 1 ms). Such images may also be multi-contrast images. This should make the present technique useful to numerous applications where high-SNR undistorted images or multiple-contrast images are desired. In some non-limiting examples, EPTI has been applied to simultaneously map $T_2$, $T_2^*$, and tissue phase, as well as to provide susceptibility weighted imaging (SWI) in the brain.

In one embodiment, each EPTI-shot covers a segment of the hybrid space of $k_y$ vs. t using a zigzag trajectory and each shot may include interleaved acceleration in the phase-encoding direction. The zig-zag trajectory ensures that neighboring $k_y$-points are acquired only a few milliseconds apart, and contain small B0-inhomogeneity induced phase and $T_2^*$ decay that can be estimated well by parallel imaging and B0-inhomogeneity-informed reconstruction. EPTI may be used with a number of reconstructions, including the "tilted-CAIPI" reconstruction, which are able to resolve the temporal evolution of EPI signals. The reconstruction may utilize compact kernels to interpolate under-sampled $k_y$-t space to fully-sampled $k_y$-t space, which may require an acquisition of a low-resolution calibration scan. A Partial Fourier transform in $k_y$ may also be implemented into EPTI to reduce the number of shots/segmentation.

In one embodiment, EPTI may be used for quantitative $T_2$ and/or $T_2^*$ mapping using single spin-echo or dual-echo (gradient-echo & spin-echo) acquisitions. EPTI may also be used for SWI using the gradient-echo portion(s) of the same acquisition, for example.

In one embodiment, a method for producing an image with a magnetic resonance imaging (MRI) system is provided that includes acquiring data with an MRI system by sampling a hybrid space along a zig-zag trajectory. The hybrid space includes a first axis along a temporal dimension and a second axis along a phase-encoding k-space dimension. An image is reconstructed based upon the acquired data. In some implementations, multi-contrast images without $B_0$ distortions or $T_2^*$ blurring may be reconstructed from the acquired data. An acceleration technique may be used to sample only a portion of the hybrid space, or alternatively the hybrid space may be fully sampled.

Referring particularly to FIG. 1A, an example sampling pattern 100 indicating phase encoding sample points as a function of time is shown. The subspace spanned by the phase encoding dimension and the temporal dimension may be referred to as a hybrid space 102. As one example, the hybrid space 102 is spanned by the $k_y$ k-space dimension and the temporal dimension, t. In general, the sampling pattern 100 may take the form of a zigzag pattern. The sampling pattern 100 is created by selectively sampling data samples 110, which are phase encoding lines in k-space.

As shown, the sampling pattern 100 includes acquiring data in a first shot 120 that samples a first portion of the hybrid space 102 and in a second shot 130 that samples a second portion of the hybrid space 102. For instance, positive phase encoding lines (e.g., +$k_y$) can be sampled in the first shot 120 and negative phase encoding lines (e.g., -$k_y$) can be sampled in the second shot 130. In other embodiments, the hybrid space can be sampled in more than two shots, in which case the hybrid space 102 can be partitioned into more segments (e.g., one segment for each shot) to enable greater acceleration of data acquisition. In some instances, these segments may partially overlap in the phase encoding dimension, or may not overlap as shown in FIG. 1A. In some other embodiments, the hybrid space 102 can be sampled in a single shot, such that both positive and negative phase encoding lines are sampled.

Figure 1B:
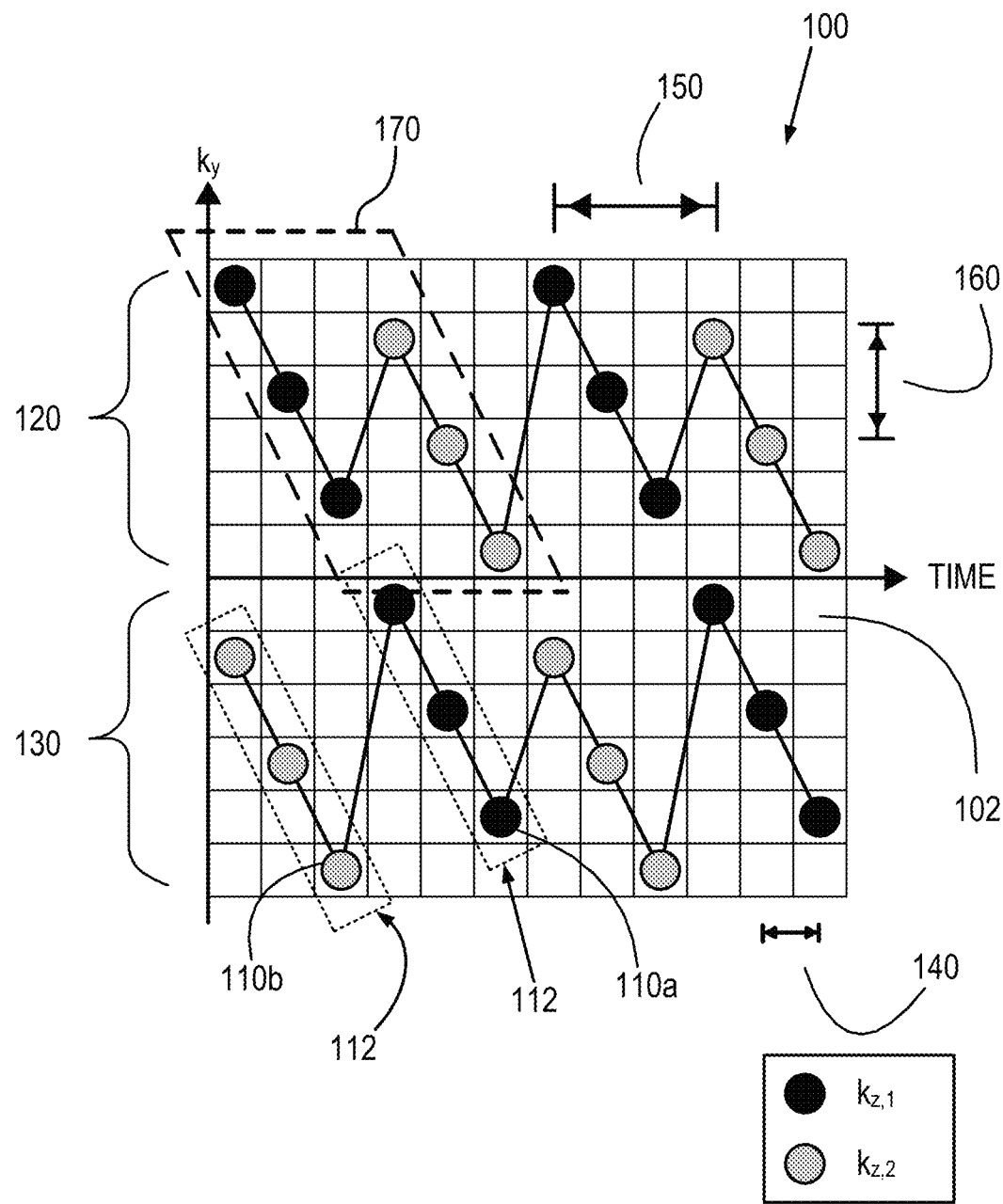
FIG. 1B is a graphic illustration of an example sampling pattern with a simultaneous multislice ("SMS") acquisition that can be employed when practicing some embodiments described in the present disclosure.

As noted and shown in FIG. 1A, the sampling pattern 100 may be a zigzag pattern that includes several linear section 112, or legs, that each include a plurality of temporally adjacent data samples 110. As shown in FIG. 1, the data samples 110 on a given section 112 of the sampling pattern 100 are acquired in a temporally sequential manner and spaced apart in time by a first temporal spacing 140, and are spaced apart along the phase encoding dimension by a spacing 160. The spacing 160 in the phase encoding dimension is selected such that the data samples 110 on a given section 112 are interleaved in the phase encoding dimension with data samples 110 on a temporally adjacent section 112 of the sampling pattern 100. In other embodiments, two or more of the data samples 110 on a given section 112 of the sampling pattern 100 may be adjacent each other in the phase encoding dimension rather than spaced apart as shown in FIG. 1.

The zigzag appearance to the sampling pattern 100 ensures that neighboring data samples 110 are acquired only a few milliseconds apart, and contain small $B_0$-inhomogeneity induced phase and $T_2^*$ decay that can be estimated well by parallel imaging and $B_0$-inhomogeneity-informed reconstruction routines. Thus, in some embodiments the first temporal spacing 140 is selected to be on the order of a few milliseconds. The first temporal spacing 140 can be more generally selected to reduce $B_0$-inhomogeneity induced phase and $T_2^*$ decay effects. As one example, the first temporal spacing 140 can be selected as the time interval of an echo spacing.

Each section 112 of the sampling pattern 100 is separated by a second temporal spacing 150. The second temporal spacing 150 can be selected as a multiple of the first temporal spacing 140, such that a specified number of data sampled 110 are acquired for a given section 112 of the sample pattern 100. As one example, the second temporal spacing 150 can be selected as $N_f=5 \cdot \Delta t$, where $\Delta t$ is the first temporal spacing 140.

Different data acceleration technique can be implemented in conjunction with the sampling pattern 100, such as an interleaved acceleration in the phase-encoding direction to reduce the number of lines sampled, which will increase the phase encoding spacing 160. Acceleration may also include reducing the number of shots that are acquired. Both forms of acceleration will increase the speed of an image acquisition. Partial Fourier techniques can also be implemented to reduce the number of shots/segmentation. Data from the first shot 120 can also be combined with data from the second shot 130 during image reconstruction to increase the number of data samples 110 acquired in the hybrid space 102, which can reduce image distortion and blurring. Any number of shots can be acquired according to sampling pattern 100 and combined to create one or more images.

Image reconstruction utilizes a kernel 170 to interpolate undersampled hybrid space 102 to a fully-sampled hybrid space 102. In some embodiments, a low-resolution calibration scan is acquired and the calibration data are used to facilitate the synthesis of additional data samples 110 in the hybrid space 102 using the reconstruction kernel 170. In general, the kernel 170 is a tilted kernel that is oriented at −45 degrees in the $k_{PE}$-t plane of the hybrid space 102; however, in other implementations the tilted kernel could also be oriented at +45 degrees in the $k_{PE}$-t plane of the hybrid space 102, or at other angles. The kernel 170 spans one or more points in the phase encoding dimension and one or more points in the temporal dimension. In the example shown in FIG. 1A, the kernel 170 spans six points in the phase encoding dimension and six points in the temporal dimension. Any suitable reconstruction routine may be used, including a tilted-CAIPI reconstruction such as those described in U.S. Patent Appln. Ser. No. 62/679,236, which is herein incorporated by reference in its entirety. Such reconstructions may allow for resolving the temporal evolution of the MR signals.

In some embodiments, simultaneous multislice ("SMS") acquisitions can be implemented in the EPTI methods described in the present disclosure. As an example, in FIG. 1B the data samples 110a and 110b are acquired with two different $k_z$ encodings, $k_{z,1}$ and $k_{z,2}$, to encode and acquire the two slices at the same time. As with the examples described above, a tilted kernel can be used to interpolate the undersampled data and to recover the 3D k-space of the two slices.

Figure 2:
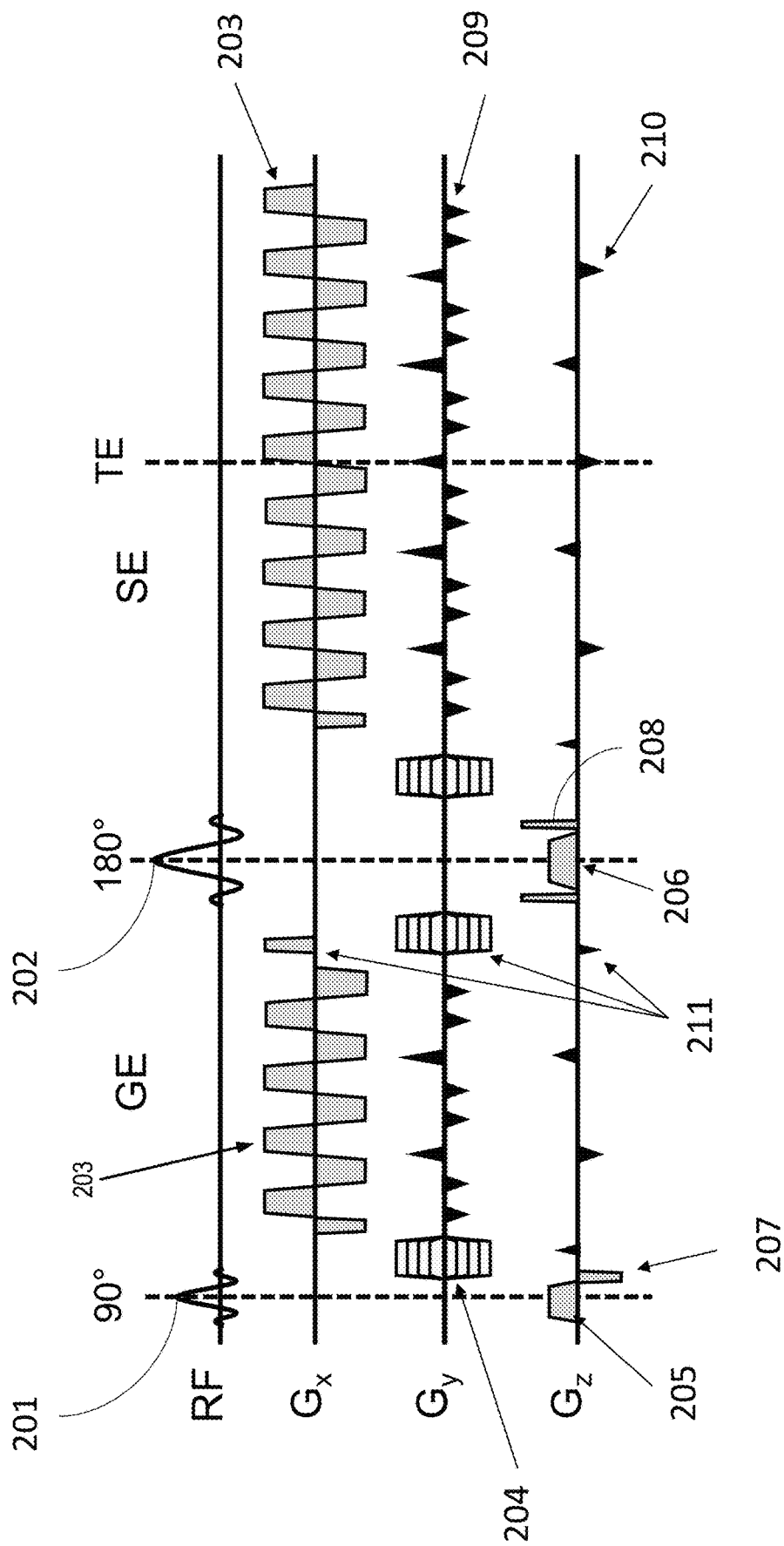
FIG. 2 is an example of a gradient-echo and spin-echo ("GESE") echo planar time-resolved imaging ("EPTI") pulse sequence for one shot, which can be implemented with some embodiments described in the present disclosure.

FIG. 2 shows an example of a pulse sequence that can be used to acquire data in accordance with some embodiments described in the present disclosure. The pulse sequence includes a radio frequency ("RF") excitation pulse 201 that is played out in the presence of a slice-select gradient 205 in order to produce transverse magnetization in a prescribed imaging slice. The slice-select gradient 205 includes a rephasing lobe 207 that acts to rephase unwanted phase dispersions. A refocusing RF pulse 202 is later applied in the presence of another slice select gradient 206 in order to refocus transverse spin magnetization. In order to reduce unwanted stimulated echoes, crusher gradients 208 bridge the slice select gradient 206. Frequency encoding gradients 203 are applied in both a gradient echo ("GE") readout occurring before the application of the refocusing RF pulse 202 and a spin echo ("SE") readout occurring after the refocusing RF pulse 202. The target EPTI sampling pattern in FIG. 1A is achieved by phase encoding gradients 204 and 209. Gradient blips 210 on the $G_z$ direction can be used to realize the SMS acquisition in FIG. 1B. The gradient module 211 is used to compensate the unwanted phase dispersion due to encoding before refocusing.

Figure 3A:
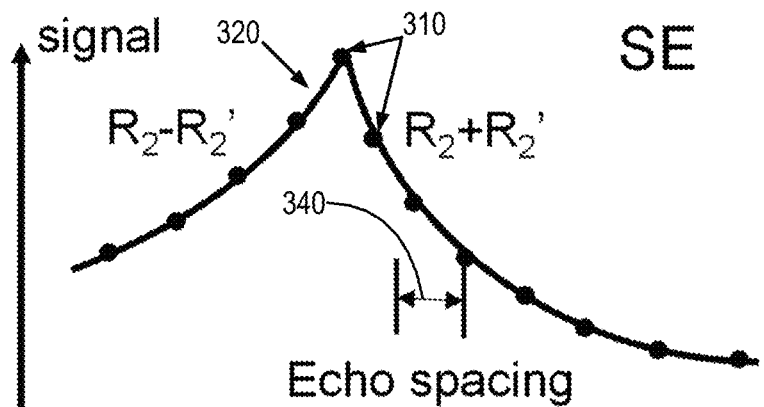
FIGS. 3A and 3B are graphic illustrations of example pulse sequence configurations that can be implemented using the methods described in the present disclosure.
Figure 3B:
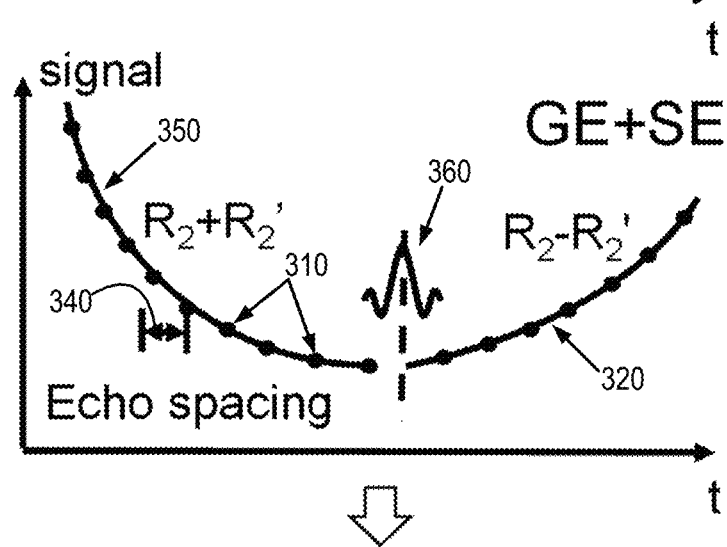

Referring particularly now to FIG. 3A, an example of a single spin-echo sequence 320 on an MRI system is shown. Referring to FIG. 3B, an example of a combined gradient-echo 350 and a spin-echo 320 sequence is shown, separated by gradient 360. In both FIG. 3A and FIG. 3B, echo spacing 340 indicates the time between echoes 310. Echo spacing 340 may be on the order of 1 ms. These sequences are non-limiting examples of sequences that may be used with the methods described in the present disclosure, and which would allow for quantitative $T_2$ and $T_2^*$ mapping. The quantitative $T_2$ and $T_2^*$ mapping may be obtained by acquiring a single spin-echo or dual-echo and may also be performed simultaneously. In one embodiment, SWI can be performed during the gradient-echo 350 portion of the sequence.

Figure 3C:
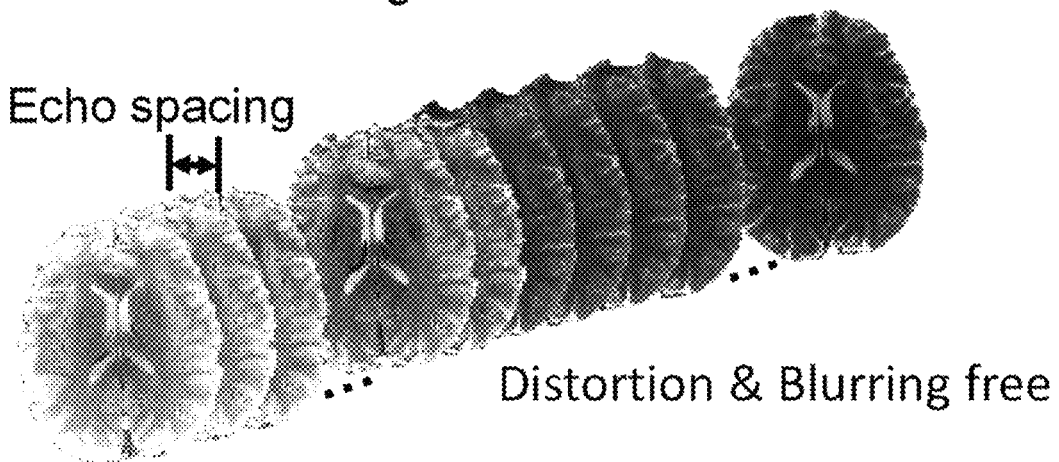
FIG. 3C is a representation of multiple contrast images reconstructed from data acquired with an EPTI acquisition in accordance with some embodiments described in the present disclosure.

As shown in FIG. 3C, multiple contrast images can be acquired using an EPTI acquisition. Each echo 310 corresponds to an image with a unique contrast, and the temporal resolution of the images is equal to an echo spacing 340. The high temporal resolution of the multi-contrast images can be used to calculate high quality quantitative mappings, such as $T_2$ maps, $T_2^*$ maps, and susceptibility maps.

Figure 4:
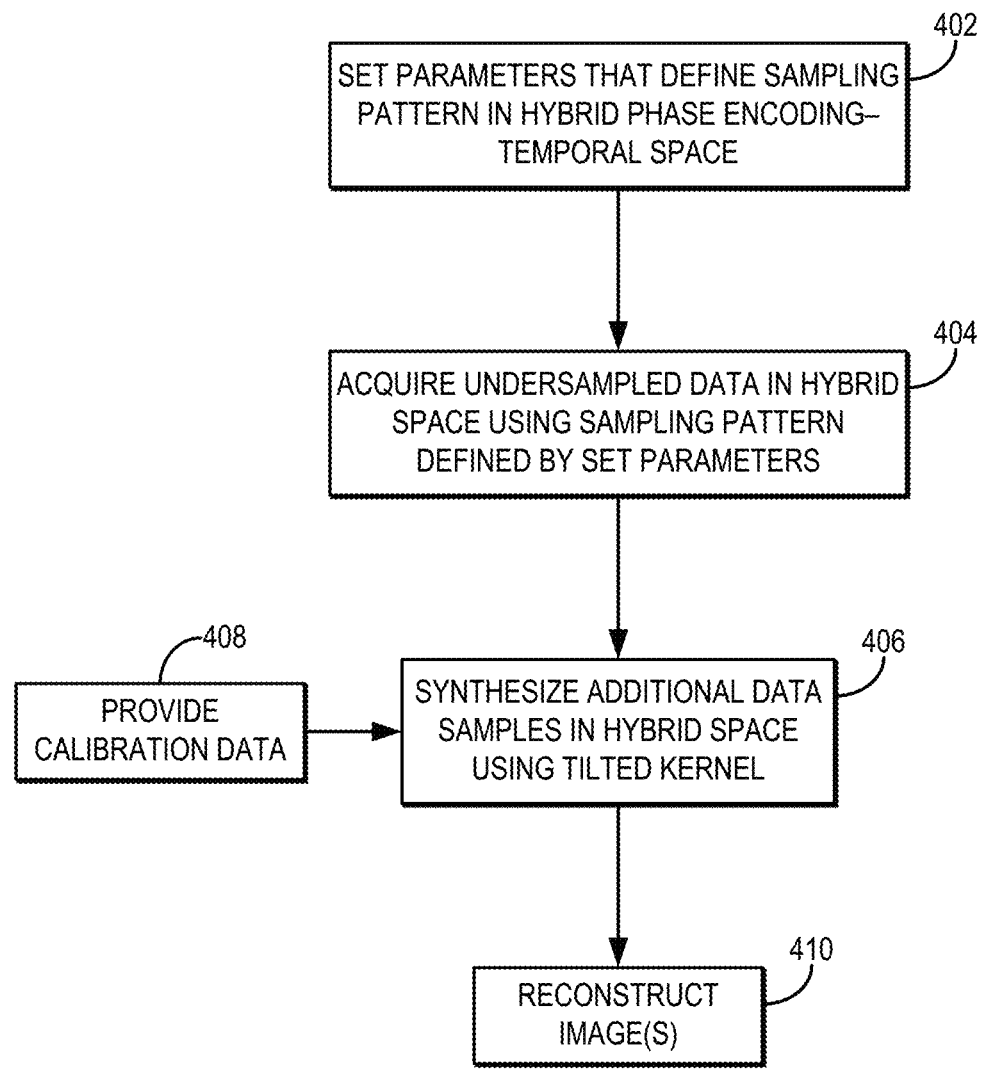
FIG. 4 is a flowchart setting forth the steps of an example method for generating images with a magnetic resonance imaging ("MRI") system using an EPTI pulse sequence according to embodiments described in the present disclosure.

Referring now to FIG. 4, a flowchart is illustrated as setting forth the steps of an example method for reconstructing one or more images using an MRI system and an EPTI pulse sequence that acquires data as described in the present disclosure. The method includes setting parameters of the sampling pattern to be used for acquiring data, as indicated at step 402. The parameters can be selected via user input to a computer system that then communicates those parameters to the MRI system. For instance, the parameters can be entered via a user interface, which may be a graphical user interface. As described above, the parameters can include a first temporal spacing between temporally adjacent data samples in each section of the hybrid space sampling pattern, a phase encoding spacing between temporally adjacent data samples in each section of the hybrid space sampling pattern, a second temporal spacing between temporally adjacent sections of the hybrid space sampling pattern, the number of sections in the hybrid space sampling pattern, the number of shots/segments of the phase encoding dimension, and so on.

After the parameters for the hybrid space sampling pattern have been selected the are communicated to the MRI system, which is then operated to perform an EPTI pulse sequence to acquire data according to the defined hybrid space sampling pattern, as indicated at step 404. As described above, data can be acquired in one or more shots. The acquired data undersample the hybrid space in order to accelerate the data acquisition process; however, using the hybrid space sampling patterns described in the present disclosure $B_0$-inhomogeneity induced phase errors and $T_2^*$ decay related blurring are reduced.

Additional data in the hybrid space are synthesized as indicated at step 406 in order to generate a data set that more fully samples the hybrid space. As mentioned above, the additional data can be synthesized using a reconstruction kernel that spans the phase encoding and temporal dimensions in the hybrid space and that is tilted with respect to the phase encoding dimension. As one example, the reconstruction kernel can span a number of temporally adjacent sections of the sampling pattern such that the data samples included in the kernel provide at least one data sample for each phase encoding line spanned by the reconstruction kernel. Based on the example in FIGS. 1A and 1B, the reconstruction kernel can span two adjacent sections of the sampling pattern, since the interleaving in these two temporally adjacent sections fully sample the phase encoding dimension spanned by the kernel. Calibration data are provided at step 408 to facilitate the synthesis of the additional data points. The calibration data can be low-resolution data acquired in a calibration scan.

One or more images of the subject are then reconstructed from the undersampled and additional data, as indicated at step 410. Any suitable reconstruction algorithm, such as those based on GRAPPA techniques, can be implemented for reconstruction. As one example, the tilted-CAIPI reconstruction techniques described in U.S. Patent Appln. Ser. No. 62/679,236, which is herein incorporated by reference in its entirety, can be used. As another example, a subspace-constrained reconstruction, such as those described below, can be implemented to reconstruct images.

As a non-limiting example implementation, the 3D-EPTI techniques described in the present disclosure can be implemented with inversion-recovery-prepared gradient-echo and spin-echo readouts to rapidly acquire a time-series of distortion-free and blurring-free multi-contrast images. The technique makes use of a time-resolved multi-shot 3D-EPI readout with a hybrid spatiotemporal CAIPI and golden-angle radial-blade sampling scheme. In one example study, with just about two minutes of 3D-EPTI acquisition, thousands of brain volume data at 1.1 mm isotropic resolution were generated at different inversion times ("TIs") and echo times ("TEs"), capturing signal evolution of T1 inversion recovery interspersed with T2/T2* decay. This acquisition enabled rapid simultaneous quantitative parameter estimation.

In this example implementation, the 3D-EPTI readout is inserted into an inversion-recovery sequence with a combined gradient- and VFA-GRASE (variable-flip-angle gradient and spin-echo) acquisition, to provide imaging time-series with mixed T1, T2, and T2* weightings. To achieve high encoding acceleration, a hybrid spatiotemporal CAIPI and golden-angle radial-blade sampling can be utilized. A subspace reconstruction, such as those described below, with locally low-rank constraint can then be used to recover thousands of high isotropic resolution 3D images at different TIs and TEs from such dataset, together with their quantitative parameters.

Figures 5A, 5B, 5C:
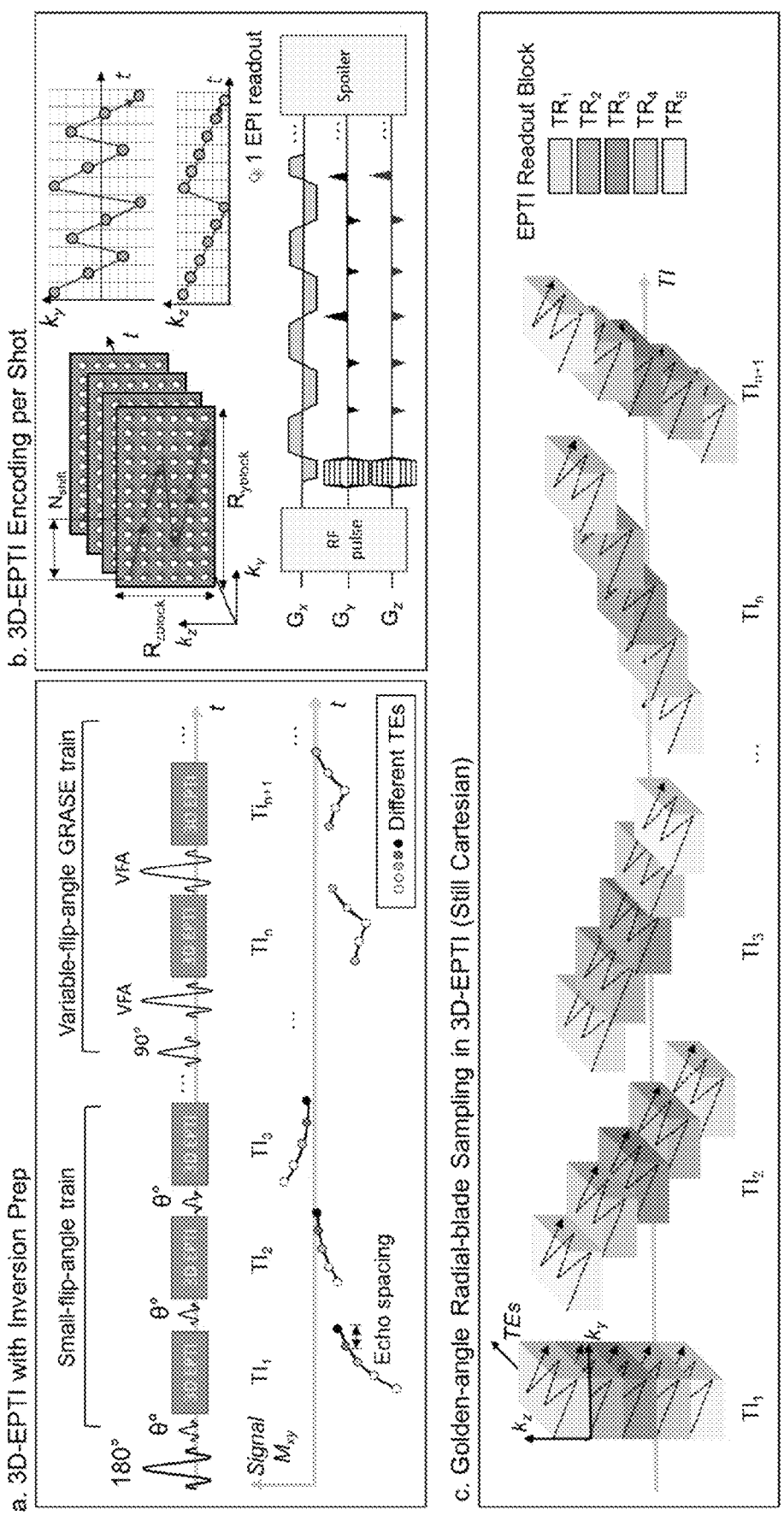
FIGS. 5A-5C show a schematic diagram of a 3D-EPTI acquisition scheme.

As illustrated in FIG. 5A, in each repetition time ("TR"), an inversion pulse followed by a small-flip-angle GE train and a VFA-GRASE readout train is applied to obtain EPTI-encoded signals, with T1 recovery interspersed with T2* and T2 decays. Each small-flip-angle/VFA RF-pulse is followed by an EPTI readout, which covers a small $k_y$-$k_z$ block of the 3D k-space using a zigzag trajectory with an interleaved acceleration in phase/partition-encoding direction as illustrated in FIG. 5B, and described above. Such spatiotemporal CAIPI trajectory enables effective use of coil sensitivity information during the reconstruction of the highly-undersampled $k_y$-$k_z$-t block.

For each TR, a series of such EPTI shots can be acquired at different TIs (FIG. 5A). Across multiple TRs, $k_y$-$k_z$ blocks acquired at the same TI form a diagonal radial-blade in $k_y$-$k_z$ space, with different blade angulation used for different TIs to compose a golden-angle radial-blade Cartesian sampling pattern (FIG. 5C). This acquisition scheme creates favorable spatiotemporal incoherent aliasing for constrained reconstruction and permits further acceleration through acquiring only 1-2 blades per TI.

A subspace reconstruction can be used to recover the images at different TIs and TEs. In this reconstruction, described in more detail below, possible signal evolution curves are first generated using tissue and acquisition parameters to extract subspace bases, which can then be used to represent the actual signal evolution. To further improve the conditioning and SNR of the reconstruction, a locally low-rank constraint can be employed. A pixel-wise matching can then be used to obtain the quantitative maps.

As noted, in some implementations a subspace-constrained reconstruction can be used to reconstruct images from data acquired using an EPTI acquisition scheme, such as those described in the present disclosure, and other k-t space sampling trajectories. Using the approach described in the present disclosure, whole-brain 1.1 mm-isotropic multi-echo images, T2* maps, and $B_0$ maps can be reconstructed from 3D-EPTI data acquired within 50 seconds.

As described above, EPTI is a multi-contrast quantitative imaging technique, which is capable of achieving rapid acquisition of distortion-free and blurring-free images at multiple TEs. In EPTI, a spatiotemporal CAIPI sampling, such as those described above, can be used to cover k-t space efficiently through customized multishot-EPI trajectories. In other instances, different EPTI sampling patterns can also be used and combined with a subspace-constrained reconstruction to further improve highly-accelerated 3D-EPTI.

The highly-undersampled $k_y$-t data can be recovered, in some instances, by exploiting signal correlation across the time and coil dimensions through a GRAPPA-like reconstruction. In such reconstructions, the edge of $k_y$-t space may not be accurately recovered through a kernel-based interpolation, which would reduce the number of echo images that can be reconstructed. Moreover, the SNR of the reconstruction can be low for high spatial resolution cases with high-undersampling. To address these issues, in some instances a subspace-constrained reconstruction can be implemented.

Figure 6A:
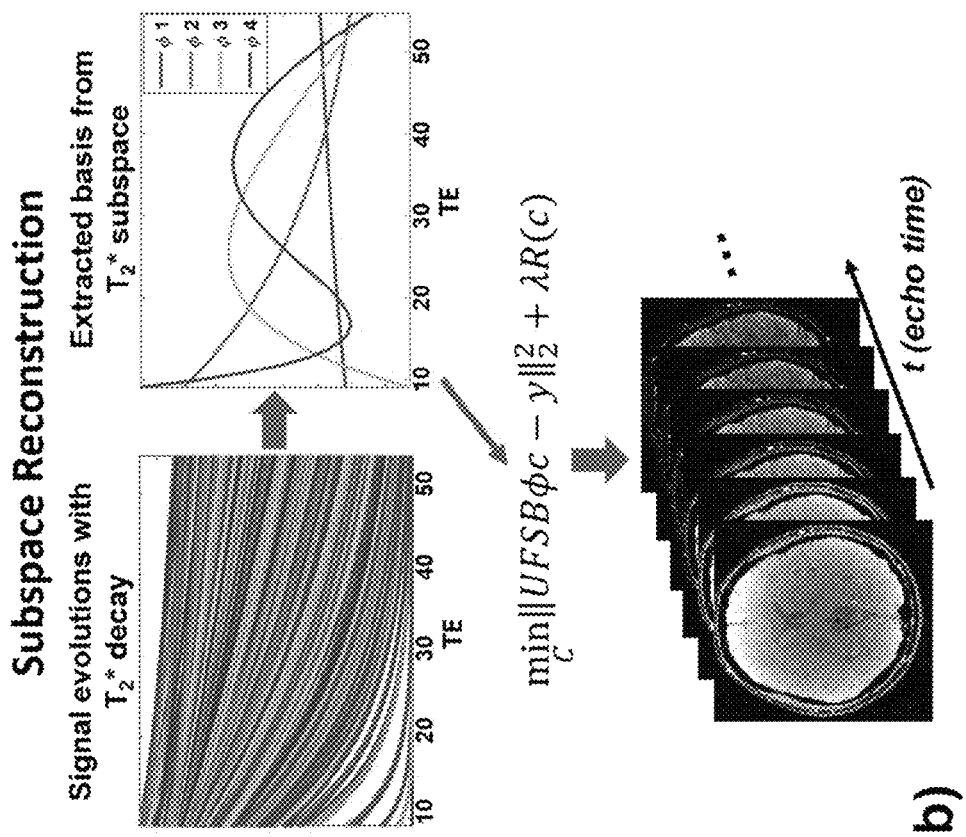
FIGS. 6A and 6B show a graphic illustration of an example EPTI acquisition and a subspace-constrained reconstruction.

As described above, in EPTI, continuous EPI readouts can be performed with spatiotemporal CAIPI-sampling to efficiently sample the desired signal evolution in k-t space. For instance, a 3D gradient-echo (GE) EPTI sequence, such as the one shown in FIG. 6A, can be used to acquire T2* signal decay data. After each RF excitation, an EPTI readout is used to cover a small $k_y$-$k_z$ block using a highly-accelerated zigzag trajectory, as shown in FIG. 6A and described above. These spatiotemporal CAIPI trajectories enable effective use of coil sensitivity in recovering highly undersampled $k_y$-$k_z$-t data within each sampling block. Acquisition across k-space blocks is performed across TRs to fill $k_y$-$k_z$ space.

Figure 6B:
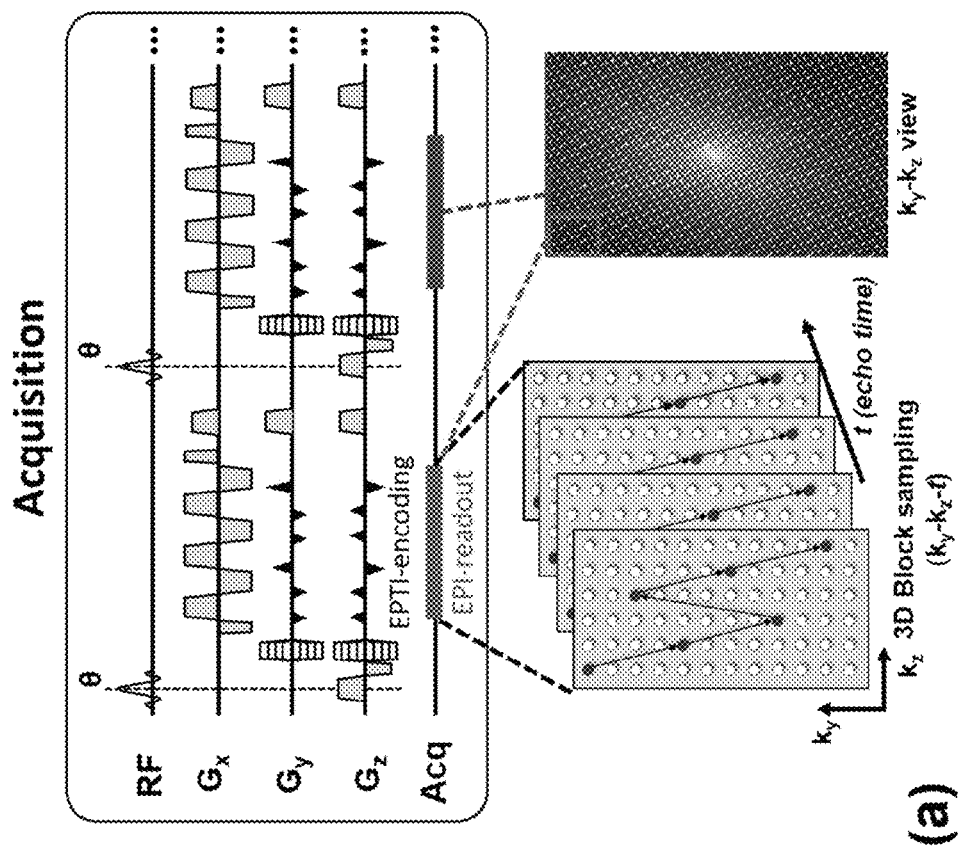
Figure 7:
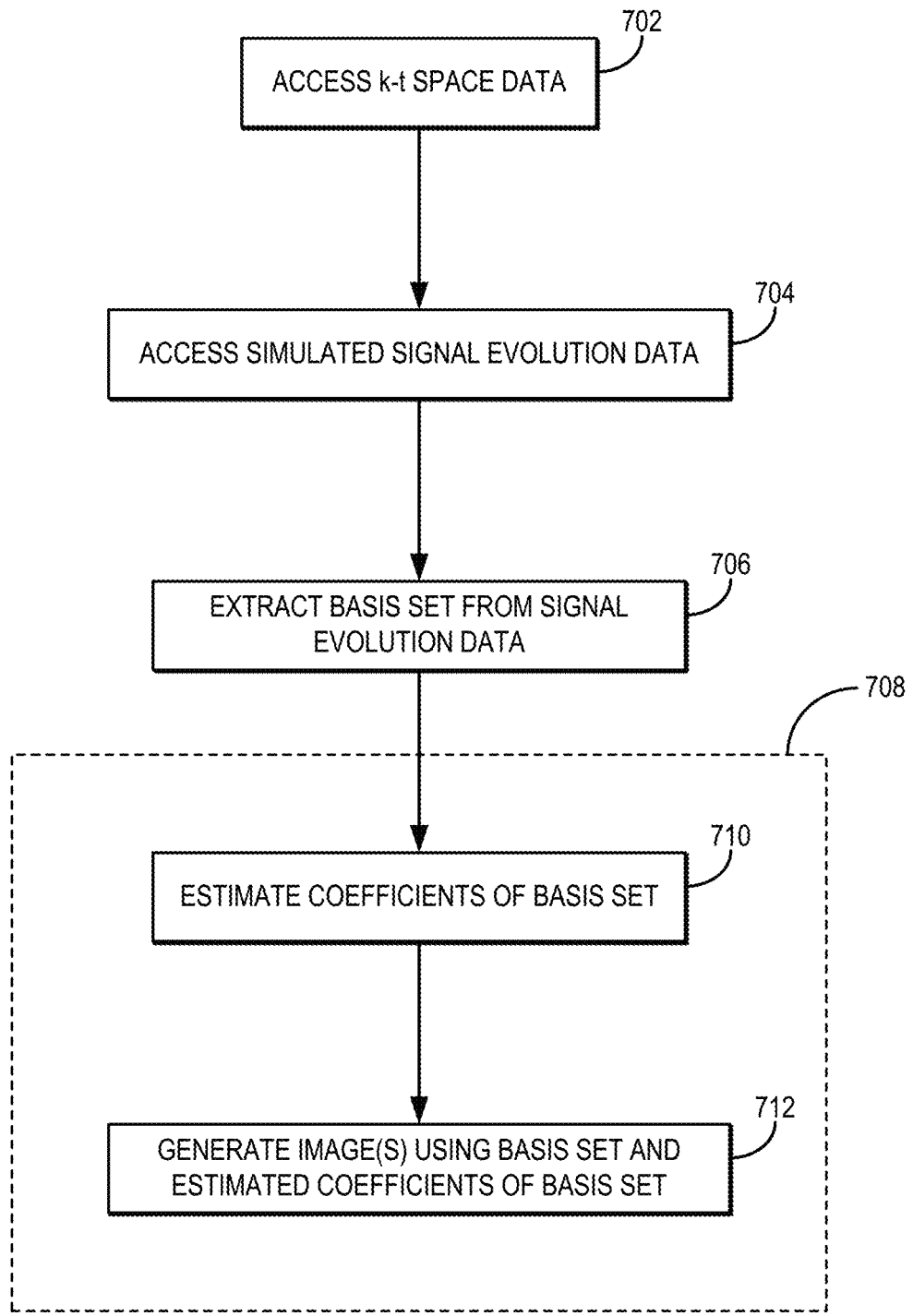
FIG. 7 is a flowchart setting forth the steps of an example method for reconstructing an image or series of images from k-t space data using a subspace-constrained reconstruction technique.
Figure 8:
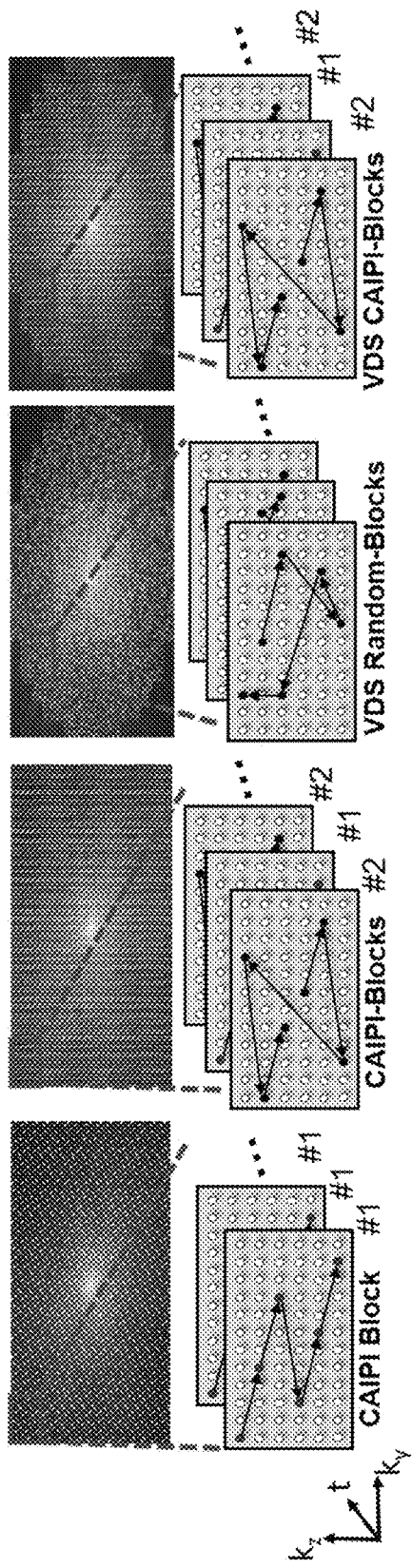
FIG. 8 shows examples of different 3D-EPTI sampling patterns that can be used when acquiring k-t space data.

To recover the signal evolution from undersampled data, a subspace-constrained reconstruction for EPTI can be implemented. A workflow for an example subspace-constrained reconstruction is shown in FIG. 6B. Further, referring now to FIG. 7, a flowchart is illustrated as setting forth the steps of an example method for reconstructing an image using a subspace-constrained reconstruction. The method includes accessing k-t space data with a computer system, as indicated at step 702. Accessing the k-t space data can include retrieving previously acquired k-t space data from a memory or other data storage device or media. In other instances, accessing the k-t space data can include acquiring such data with an MRI system and communicating the k-t space data from the MRI system to the computer system, which may form a part of the MRI system. The k-t space data can be acquired using the spatiotemporal CAIPI trajectories described above, using the k-t space trajectories shown in FIG. 8, or using otherwise suitable k-t space trajectories. FIG. 8 shows four different EPTI sampling strategies: two different regular CAIPI-like EPTI samplings, a variable density ("VDS") random-sampling, and a VDS CAIPI-sampling.

The method further includes simulating signal evolution data, as indicated at step 704. This step may also include accessing previously simulated signal evolution data. The signal evolution data are simulated within a parameter range, such as a possible parameter range based on the acquisition parameters used to acquire the k-t space data. The signal evolution may be, for instance, a T2* decay as described above; however, other signal evolutions can also be simulated, including those based on T1 decay, T2 decay, diffusion weighting, and so on.

A plurality of bases are extracted from the signal evolution data, as indicated at step 706. As one example, the bases can be extracted using a principal component analysis ("PCA"). The bases form a low-dimensional subspace that can be used to approximate the signal space.

Using these bases, images (e.g., a temporal image series) are reconstructed using a subspace-constrained reconstruction, as indicated generally at process block 708. First, the coefficient map, c, of the bases, ϕ, is estimated, as indicated at step 710. Using this approach, the degrees of freedom of reconstruction can be reduced from the number of time points to the number of bases, which improves conditioning of the reconstruction and image-SNR. The coefficient map can be recovered by solving the subspace-constrained reconstruction problem:

$$\min_{c} \|UFSB\phi c - y\|_2^2 + \lambda R(c); \tag{1}$$

where B is temporal $B_0$ phase-evolution, S is coil sensitivity, F is a Fourier transform, U is an undersampling mask, and y is the acquired k-t space data, which may be undersampled $k_x$-$k_y$-$k_z$-t data. Regularization, R(c), can be used to improve the conditioning and SNR for higher undersampling. When using a VDS sampling scheme, a locally low-rank ("LLR") constraint can be employed. The $B_0$ phase evolution and coil sensitivity in the forward model can be estimated using calibration data, such as a fast-low-resolution calibration data with six gradient echoes. The subspace-constrained reconstruction can also be augmented with phase-cycling to extract high-resolution phase data without the need of high-resolution $B_0$ calibration scans. For instance, high-resolution $B_0$ maps can also be estimated by a phase-cycling approach using the reconstructed magnitude images and acquired signals.

After estimating the coefficient map, c, the images can be generated by computing ϕc, as indicated at step 712. Subspace-constrained reconstruction can improve the performance of EPTI for better signal evolution recovery, and the designed 3D sampling strategy enables efficient high-resolution EPTI, providing a powerful technique for fast multi-contrast and quantitative imaging.

Figure 9:
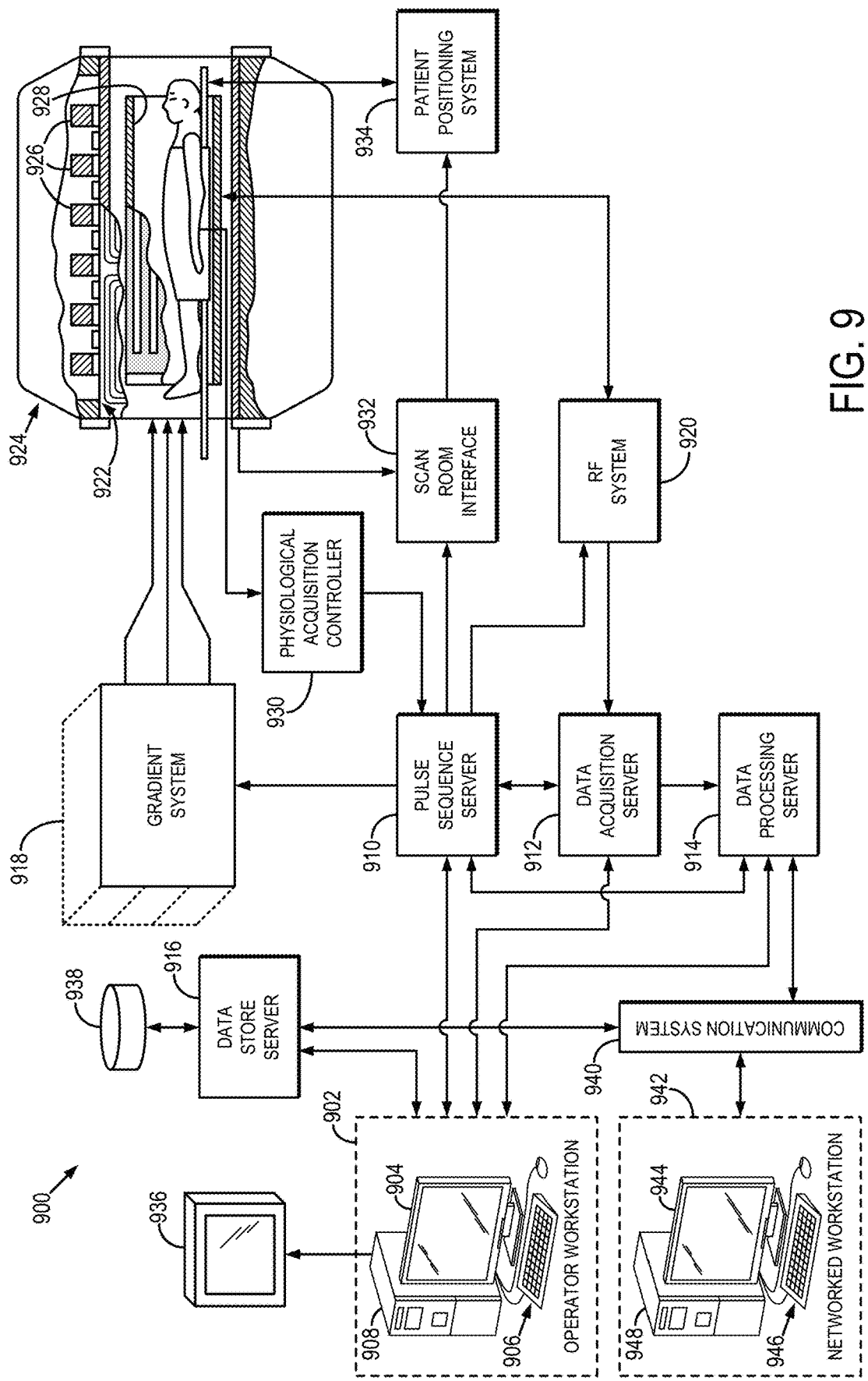
FIG. 9 is a block diagram of an example of an MRI system that can implement some embodiments described in the present disclosure.

Referring particularly now to FIG. 9, an example of an MRI system 900 that can implement the methods described here is illustrated. The MRI system 900 includes an operator workstation 902 that may include a display 904, one or more input devices 906 (e.g., a keyboard, a mouse), and a processor 908. The processor 908 may include a commercially available programmable machine running a commercially available operating system. The operator workstation 902 provides an operator interface that facilitates entering scan parameters into the MRI system 900. The operator workstation 902 may be coupled to different servers, including, for example, a pulse sequence server 910, a data acquisition server 912, a data processing server 914, and a data store server 916. The operator workstation 902 and the servers 910, 912, 914, and 916 may be connected via a communication system 940, which may include wired or wireless network connections.

The pulse sequence server 910 functions in response to instructions provided by the operator workstation 902 to operate a gradient system 918 and a radiofrequency ("RF") system 920. Gradient waveforms for performing a prescribed scan are produced and applied to the gradient system 918, which then excites gradient coils in an assembly 922 to produce the magnetic field gradients $G_x$, $G_y$, and $G_z$ that are used for spatially encoding magnetic resonance signals. The gradient coil assembly 922 forms part of a magnet assembly 924 that includes a polarizing magnet 926 and a whole-body RF coil 928.

RF waveforms are applied by the RF system 920 to the RF coil 928, or a separate local coil to perform the prescribed magnetic resonance pulse sequence. Responsive magnetic resonance signals detected by the RF coil 928, or a separate local coil, are received by the RF system 920. The responsive magnetic resonance signals may be amplified, demodulated, filtered, and digitized under direction of commands produced by the pulse sequence server 910. The RF system 920 includes an RF transmitter for producing a wide variety of RF pulses used in MRI pulse sequences. The RF transmitter is responsive to the prescribed scan and direction from the pulse sequence server 910 to produce RF pulses of the desired frequency, phase, and pulse amplitude waveform. The generated RF pulses may be applied to the whole-body RF coil 928 or to one or more local coils or coil arrays.

The RF system 920 also includes one or more RF receiver channels. An RF receiver channel includes an RF preamplifier that amplifies the magnetic resonance signal received by the coil 928 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \qquad (2);$$

and the phase of the received magnetic resonance signal may also be determined according to the following relationship:

$$\varphi = \tan^{-1}\left(\frac{Q}{I}\right). \qquad (3)$$

The pulse sequence server 910 may receive patient data from a physiological acquisition controller 930. By way of example, the physiological acquisition controller 930 may receive signals from a number of different sensors connected to the patient, including electrocardiograph ("ECG") signals from electrodes, or respiratory signals from a respiratory bellows or other respiratory monitoring devices. These signals may be used by the pulse sequence server 910 to synchronize, or "gate," the performance of the scan with the subject's heart beat or respiration.

The pulse sequence server 910 may also connect to a scan room interface circuit 932 that receives signals from various sensors associated with the condition of the patient and the magnet system. Through the scan room interface circuit 932, a patient positioning system 934 can receive commands to move the patient to desired positions during the scan.

The digitized magnetic resonance signal samples produced by the RF system 920 are received by the data acquisition server 912. The data acquisition server 912 operates in response to instructions downloaded from the operator workstation 902 to receive the real-time magnetic resonance data and provide buffer storage, so that data is not lost by data overrun. In some scans, the data acquisition server 912 passes the acquired magnetic resonance data to the data processor server 914. In scans that require information derived from acquired magnetic resonance data to control the further performance of the scan, the data acquisition server 912 may be programmed to produce such information and convey it to the pulse sequence server 910. For example, during pre-scans, magnetic resonance data may be acquired and used to calibrate the pulse sequence performed by the pulse sequence server 910. As another example, navigator signals may be acquired and used to adjust the operating parameters of the RF system 920 or the gradient system 918, or to control the view order in which k-space is sampled. In still another example, the data acquisition server 912 may also process magnetic resonance signals used to detect the arrival of a contrast agent in a magnetic resonance angiography ("MRA") scan. For example, the data acquisition server 912 may acquire magnetic resonance data and processes it in real-time to produce information that is used to control the scan.

The data processing server 914 receives magnetic resonance data from the data acquisition server 912 and processes the magnetic resonance data in accordance with instructions provided by the operator workstation 902. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 914 are conveyed back to the operator workstation 902 for storage. Real-time images may be stored in a data base memory cache, from which they may be output to operator display 902 or a display 936. Batch mode images or selected real time images may be stored in a host database on disc storage 938. When such images have been reconstructed and transferred to storage, the data processing server 914 may notify the data store server 916 on the operator workstation 902. The operator workstation 902 may be used by an operator to archive the images, produce films, or send the images via a network to other facilities.

The MRI system 900 may also include one or more networked workstations 942. For example, a networked workstation 942 may include a display 944, one or more input devices 946 (e.g., a keyboard, a mouse), and a processor 948. The networked workstation 942 may be located within the same facility as the operator workstation 902, or in a different facility, such as a different healthcare institution or clinic.

The networked workstation 942 may gain remote access to the data processing server 914 or data store server 916 via the communication system 940. Accordingly, multiple networked workstations 942 may have access to the data processing server 914 and the data store server 916. In this manner, magnetic resonance data, reconstructed images, or other data may be exchanged between the data processing server 914 or the data store server 916 and the networked workstations 942, such that the data or images may be remotely processed by a networked workstation 942.

Figure 10:
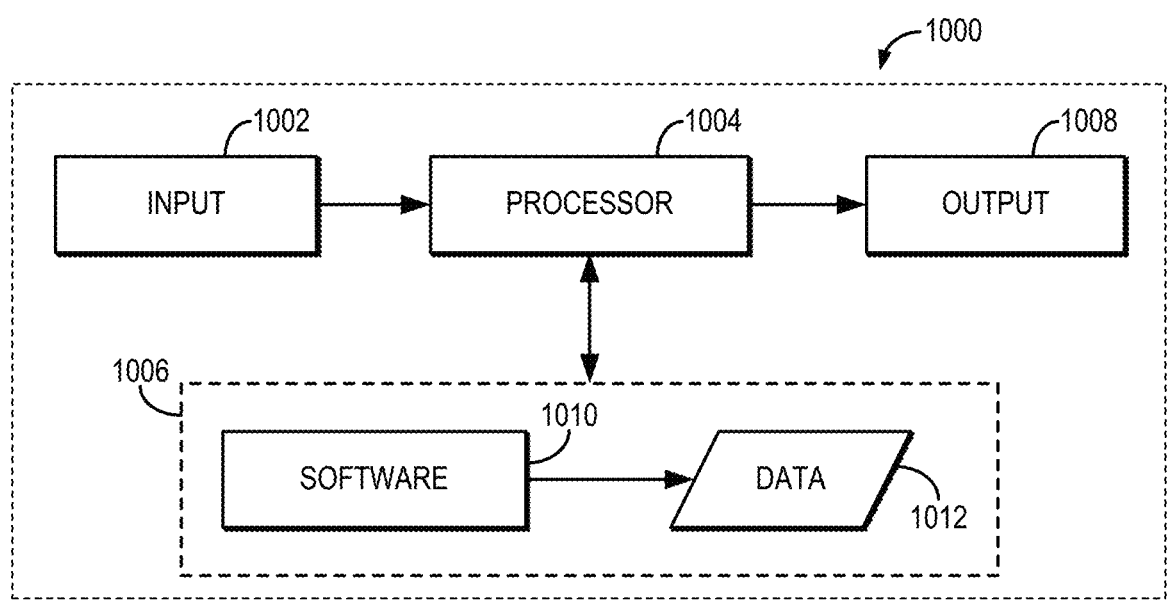
FIG. 10 is a block diagram of an example computer system that can implement some embodiments described in the present disclosure.

Referring now to FIG. 10, a block diagram of an example of a computer system 1000 that can perform the methods described in the present disclosure is shown. The computer system 1000 generally includes an input 1002, at least one hardware processor 1004, a memory 1006, and an output 1008. Thus, the computer system 1000 is generally implemented with a hardware processor 1004 and a memory 1006.

In some embodiments, the computer system 1000 can be a workstation, a notebook computer, a tablet device, a mobile device, a multimedia device, a network server, a mainframe, one or more controllers, one or more microcontrollers, or any other general-purpose or application-specific computing device.

The computer system 1000 may operate autonomously or semi-autonomously, or may read executable software instructions from the memory 1006 or a computer-readable medium (e.g., a hard drive, a CD-ROM, flash memory), or may receive instructions via the input 1002 from a user, or any another source logically connected to a computer or device, such as another networked computer or server. Thus, in some embodiments, the computer system 1000 can also include any suitable device for reading computer-readable storage media.

In general, the computer system 1000 is programmed or otherwise configured to implement the methods and algorithms described in the present disclosure. For instance, the computer system 1000 can be programmed to reconstruct images from k-t space data using a subspace-constrained reconstruction or other suitable reconstruction algorithm.

The input 1002 may take any suitable shape or form, as desired, for operation of the computer system 1000, including the ability for selecting, entering, or otherwise specifying parameters consistent with performing tasks, processing data, or operating the computer system 1000. In some aspects, the input 1002 may be configured to receive data, such as data acquired with an MRI system. Such data may be processed as described above to reconstruct images. In addition, the input 1002 may also be configured to receive any other data or information considered useful for reconstructing images using the methods described above.

Among the processing tasks for operating the computer system 1000, the one or more hardware processors 1004 may also be configured to carry out any number of post-processing steps on data received by way of the input 1002.

The memory 1006 may contain software 1010 and data 1012, such as data acquired with an MRI system, and may be configured for storage and retrieval of processed information, instructions, and data to be processed by the one or more hardware processors 1004. In some aspects, the software 1010 may contain instructions directed to reconstructing images from k-t space data using a subspace-constrained reconstruction, or other suitable reconstruction algorithm.

In addition, the output 1008 may take any shape or form, as desired, and may be configured for displaying reconstructed images, in addition to other desired information.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (e.g., hard disks, floppy disks), optical media (e.g., compact discs, digital video discs, Blu-ray discs), semiconductor media (e.g., random access memory ("RAM"), flash memory, electrically programmable read only memory ("EPROM"), electrically erasable programmable read only memory ("EEPROM")), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

The present disclosure has described one or more preferred embodiments, and it should be appreciated that many equivalents, alternatives, variations, and modifications, aside from those expressly stated, are possible and within the scope of the invention.

The invention claimed is:

1. A method for producing an image with a magnetic resonance imaging (MRI) system, the steps comprising:
 a) acquiring data with an MRI system by sampling a hybrid space along a zigzag trajectory, wherein the hybrid space comprises a first axis along a temporal dimension and a second axis along a phase-encoding k-space dimension, and
 b) reconstructing an image from the acquired data.

2. The method of claim 1 wherein the acquire data undersample the hybrid space and step b) includes synthesizing additional data in the hybrid space using a reconstruction kernel that spans the phase-encoding k-space dimension and the temporal dimension, wherein the image is reconstructed from the acquired data and the additional data.

3. The method of claim 2 wherein the reconstruction kernel is a tilted reconstruction kernel that is oriented at an angle with respect to the phase-encoding k-space dimension in the hybrid space.

4. The method of claim 3 wherein the zigzag trajectory comprises a plurality of temporally adjacent linear sections each comprising a plurality of temporally adjacent data samples that are spaced apart along the phase-encoding k-space dimension, and wherein the reconstruction kernel spans at least two of the plurality of temporally adjacent linear sections.

5. The method of claim 1 wherein the zigzag trajectory comprises a plurality of temporally adjacent linear sections each comprising a plurality of temporally adjacent data samples that are spaced apart along the phase-encoding k-space dimension by a phase encoding spacing and are spaced apart along the temporal dimension by a temporal spacing.

6. The method of claim 5 wherein the temporal spacing is selected to minimize $B_0$-inhomogeneity induced phase and $T_2^*$ decay.

7. The method of claim 6 wherein the temporal spacing is less than a few milliseconds.

8. The method of claim 5 wherein the phase encoding spacing is selected such that data samples in the plurality of temporally adjacent linear sections are interleaved in the phase encoding dimension.

9. The method of claim 1 wherein the zigzag trajectory includes a first sample segment spanning a first segment of the phase-encoding k-space dimension and a second sample segment spanning a second segment of the phase-encoding k-space dimension.

10. The method of claim 9 wherein data are acquired from the first sample segment in a first repetition time and data are acquired from the second sample segment in a second repetition time.

11. The method of claim 1 wherein the data comprise a plurality of three-dimensional (3D) data sets are acquired over a plurality of repetition time (TR) periods, wherein in each 3D data set is acquired by applying an inversion recovery (IR) radio frequency (RF) pulse following by a small-flip-angle echo train and a variable flip angle echo train.

12. The method of claim 11 wherein the hybrid space comprises a $k_y$-$k_z$-t space, wherein $k_y$ is a phase encoding dimension, $k_z$ is a partition encoding dimension, and t is a temporal dimension.

13. The method of claim 12 wherein each data set comprises data acquired at different inversion times (TI), such that across multiple TRs $k_y$-$k_z$ blocks of the data acquired at similar Tis form a radial blade in $k_y$-$k_z$ space.

14. The method of claim 13 wherein each radial blade has a different angulation in $k_y$-$k_z$ space based on the TI associated with that radial blade.

15. The method of claim 14 wherein the angulation in $k_y$-$k_z$ space is selected based on a golden angle sampling pattern.

16. A method for producing an image with a magnetic resonance imaging (MRI) system, the steps comprising:
 a) acquiring data with an MRI system by sampling k-space along a plurality of interleaved phase encoding lines such that temporally adjacent phase encoding lines are separated in time by a first temporal spacing and phase encoding lines that are adjacent in k-space are separated in time by a second temporal spacing that is greater than the first temporal spacing, and b) reconstructing an image based upon the acquired data.

17. The method of claim 16 wherein the first temporal spacing is selected to minimize $B_0$-inhomogeneity induced phase and $T_2^*$ decay.

18. The method of claim 16 wherein the first temporal spacing is less than a few milliseconds.

19. The method of claim 16 wherein the image is reconstructed using a subspace-constrained reconstruction comprising:

simulating signal evolution data;

extracting a basis set defining a subspace of the signal evolution data;

estimating coefficients of the basis set; and generating an image using the coefficients of the basis set.

20. The method of claim 19 wherein estimating the coefficients of the basis set comprises minimizing an objective function, $$\|UFSB\phi c - y\|_2^2;$$

wherein $\phi$ is the basis set, c are the coefficients of the basis set, B is temporal $B_0$ phase-evolution, S is coil sensitivity, F is a Fourier transform, U is an undersampling mask, and y is the acquired data.

21. A method for reconstructing an image from data acquired with a magnetic resonance imaging (MRI) system, the method comprising:

(a) accessing with a computer system, k-t space data acquired with an MRI system;

(b) accessing with the computer system, signal evolution data comprising magnetic resonance signal evolutions simulated based on acquisition parameters used when acquiring the k-t space data;

(c) extracting a basis set from the signal evolution data using the computer system;

(d) estimating coefficients of the basis set from the k-t space data using the computer system to reconstruct a coefficient map using a subspace-constrained reconstruction, wherein the coefficient map contains the coefficients of the basis set; and (e) reconstructing an image by applying the coefficient map to the basis set, generating output as the image, wherein the image has an increased signal-to-noise ratio based on applying the coefficient map to the base set.

22. The method of claim 21 wherein the basis set is extracted from the signal evolution data using a principal component analysis.

23. The method of claim 21 wherein the coefficients of the basis set are estimated by minimizing an objective function, $$\|UFSB\phi c - y\|_2^2;$$

wherein $\phi$ is the basis set, c are the coefficients of the basis set, B is temporal $B_0$ phase-evolution, S is coil sensitivity, F is a Fourier transform, U is an undersampling mask, and y is the acquired data.

24. The method of claim 21 wherein the k-t space data comprise data acquired by sampling k-t space along a zigzag trajectory comprising a plurality of temporally adjacent linear sections each comprising a plurality of temporally adjacent data samples that are spaced apart along a phase-encoding k-space dimension.

25. The method of claim 24 wherein the zigzag trajectory implements a variable density sampling of k-t space.

26. The method of claim 21 wherein the k-t space data comprise data acquired by sampling k-t space using a random variable sampling density.

* * * * *

UNITED STATES PATENT AND TRADEMARK OFFICE
CERTIFICATE OF CORRECTION

PATENT NO. : 11,022,665 B2  
APPLICATION NO. : 16/430349  
DATED : June 1, 2021  
INVENTOR(S) : Setsompop et al.

Page 1 of 1

It is certified that error appears in the above-identified patent and that said Letters Patent is hereby corrected as shown below:

In the Specification

Column 3, Line 33, "the k dimension" should be --the $k_y$ dimension--.

Column 3, Lines 34-35, "as k-t space" should be --as $k_y$-t space--.

In The Claims

Column 16, Claim 21, Line 11, "the base" should be --the basis--.

Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*